United States Patent
Fan et al.

(10) Patent No.: US 9,502,582 B2
(45) Date of Patent: Nov. 22, 2016

(54) NON-VOLATILE MEMORY UNIT AND METHOD FOR MANUFACTURING THE SAME

(71) Applicant: Xinnova Technology Limited, Beijing (CN)

(72) Inventors: Der-Tsyr Fan, Taoyuan County (TW); Chih-Ming Chen, Hsin-chu (TW); Jung-Chang Lu, Hsin-chu (TW)

(73) Assignee: XINNOVA TECHNOLOGY LIMITED, Beijing (CN)

( * ) Notice: Subject to any disclaimer, the term of this patent is extended or adjusted under 35 U.S.C. 154(b) by 0 days.

(21) Appl. No.: 14/994,617

(22) Filed: Jan. 13, 2016

(65) Prior Publication Data

US 2016/0204272 A1    Jul. 14, 2016

Related U.S. Application Data

(60) Provisional application No. 62/102,639, filed on Jan. 13, 2015.

(51) Int. Cl.

| | |
|---|---|
| *H01L 27/108* | (2006.01) |
| *H01L 27/115* | (2006.01) |
| *H01L 21/28* | (2006.01) |
| *H01L 29/76* | (2006.01) |
| *H01L 29/788* | (2006.01) |
| *H01L 29/40* | (2006.01) |
| *H01L 29/66* | (2006.01) |
| *H01L 29/423* | (2006.01) |
| *H01L 21/265* | (2006.01) |
| *H01L 21/02* | (2006.01) |

(52) U.S. Cl.
CPC ..... *H01L 29/7883* (2013.01); *H01L 21/26513* (2013.01); *H01L 21/28273* (2013.01); *H01L 27/11521* (2013.01); *H01L 29/401* (2013.01); *H01L 29/42328* (2013.01); *H01L 29/66825* (2013.01); *H01L 21/02238* (2013.01); *H01L 27/11524* (2013.01)

(58) Field of Classification Search
CPC ............. H01L 29/7883; H01L 29/401; H01L 29/42328; H01L 29/66825; H01L 21/26513; H01L 21/02238; H01L 21/28273; H01L 27/11521; H01L 27/11524
USPC ........ 438/257, 258, 259, 264, 594; 257/313, 257/314, 315, 316, 319, 320, 321, E21.69, 257/E21.209, E21.422, E21.682, E27.103, 257/E29.306; 365/185.05, 185.17, 185.18
See application file for complete search history.

(56) References Cited

U.S. PATENT DOCUMENTS

| | | | |
|---|---|---|---|
| 6,893,921 B2* | 5/2005 | Ding | H01L 29/42324 438/259 |
| 7,053,438 B2* | 5/2006 | Ding | H01L 27/105 257/314 |

(Continued)

*Primary Examiner* — Dao H Nguyen
(74) *Attorney, Agent, or Firm* — Chun-Ming Shih

(57) ABSTRACT

A non-volatile memory unit includes a substrate, a first dielectric layer, an erase gate, a floating gate, a second dielectric layer, a coupled dielectric layer and a couple control gate. The substrate has a source region and a drain region, and the first dielectric layer is formed on the substrate. The erase gate, the floating gate, the second dielectric layer and the selective gate are formed on the first dielectric layer. The second dielectric layer and coupled dielectric layer are formed among and above the erase gate, the floating gate and the selective gate, and the couple control gate is formed on the coupled dielectric layer.

18 Claims, 11 Drawing Sheets

(56) References Cited

U.S. PATENT DOCUMENTS

| | | | |
|---|---|---|---|
| 7,598,561 B2* | 10/2009 | Chen | H01L 29/7885 257/314 |
| 2004/0130947 A1* | 7/2004 | Fan | G11C 16/0433 365/185.05 |
| 2005/0146937 A1* | 7/2005 | Fan | G11C 16/0433 365/185.17 |
| 2015/0008509 A1* | 1/2015 | Charpin-Nicolle | H01L 21/28282 257/326 |

* cited by examiner

NON-VOLATILE MEMORY UNIT AND METHOD FOR MANUFACTURING THE SAME

BACKGROUND

Technical Field

This disclosure relates to a non-volatile memory unit and method for manufacturing the same, in particular, to a damascene and a flattening process using dielectric layer as a hard mask to form erase gate and selective gate.

Related Art

A split gate unit is widely used in independent and embedded type non-volatile application. Since it has a smaller sector cleaning and a more easily supported circuit design, in the embedded non-volatile IC industry it becomes more and more important. For instance, could be used at the MCU and smartcard.

In previous non-volatile memory units of split gate of the Microchip™ and SST™ are consider to be easily manufactured and have reliable reliabilities, thus are considered a most approval solution nowadays. In the core of the non-volatile memory unit, double layered polycrystalline silicon layer is consider as the floating gate of the first polycrystalline silicon layer and selective gate of the second polycrystalline silicon layer. As the IC device become smaller and smaller, the double polycrystalline silicon of slit gate could not satisfy the nowadays' trend.

By adding addition polycrystalline silicon layer for couple control gate, the tri-polycrystalline silicon split gate is getting smaller and also gains its importance. In the core of the non-volatile, in this technique, the three-layer polycrystalline silicon is considered as the floating gate of the first polycrystalline silicon layer, the second polycrystalline silicon layer as couple control gate, and the third polycrystalline silicon layer as erase gate/selective gate.

Similar to convention non-volatile memory unit of stacking gat, such as ETOX. First of all, forming the floating gate along the bit line direction, and forming the couple control gate (CG) as mask for etching the floating gate. By back-etching tri-polycrystalline silicon to form the erase gate and the select separator of the erase gate and selective gate. Since the erase gate and select separator includes different gate dielectric for different usage, so the fabrication process of the transistor oxide layer of the selective gate and the tunnel oxide layer have to be carefully consider.

Unfortunately, at the existing split gate structure and manufacturing method the above said request are hard to realize. The dielectric between the floating gate and the selective gate has to integrate to the combination of the tunneling oxide layer, which disposed between the floating gate and the selective gate. Therefore, the manufacturing process will be more complicate and lack of flexibility thus became a closed system. Finally and most importantly, now existing tri-polycrystalline silicon split gate cannot avoid involving etching, and growing of the oxidizing layer with rough surface of the floating gate. The floating gate is used in erasing the nodes. Assume that the surface of the polycrystalline silicon and the tunneling oxide layer are not carefully handle, the uneven micro surface structure of the floating gate polycrystalline silicon will not be able to cause the tunneling effect of the tunnel oxidation layer thus affect the reliability.

SUMMARY

In view of the aforementioned problems, this disclosure provides a non-volatile memory unit and method for manufacturing the same, to a damascene and a flattening process using dielectric layer for hard mask to form erase gate and selective gate.

Another objection of the present invention is to provide a non-volatile memory unit and method that could form ON or ONO separator at the sidewall of selective gate. With this arrangement, the floating gate and the selective gate could be electrical isolated.

Accordingly, this disclosure provides a method for manufacturing a non-volatile memory unit that comprises:

providing a substrate;

forming a first base dielectric layer on the substrate;

forming a sacrificial layer on the a first base dielectric layer;

defining a first pattern opening and a second pattern opening at the first base dielectric layer and the sacrificial layer;

performing ion implantation according to the first pattern opening;

selectively changing the thickness of the first base dielectric layer in order to from damascene grooves that spaced apart along the horizontal direction;

forming a first polycrystalline silicon layer on the first base dielectric layer and the first polycrystalline silicon layer is formed in the damascene grooves;

forming a covering dielectric layer on the first polycrystalline silicon layer;

forming a second base dielectric layer on the substrate, and the first polycrystalline silicon layer and the covering dielectric layer together form a sidewall dielectric layer;

forming a second polycrystalline silicon layer at a space that extends along the horizontal direction between the first polycrystalline silicon layer and the sidewall dielectric layer;

forming a coupled dielectric layer on the second polycrystalline silicon layer, the sidewall dielectric layer and the covering dielectric layer;

selectively forming a third polycrystalline silicon layer on the coupled dielectric layer; and defining a third pattern opening and performing ion implantation.

According to one embodiment of the present invention, since the photoresist is a hard mask, the etching process of a scarifying layer is operated at the region outside the first pattern opening and the second pattern opening, and forming a separated scarifying layer on the first base dielectric layer.

According to one embodiment of the present invention, via the first pattern opening, forming a thickened first base dielectric layer under the first pattern opening.

According to one embodiment of the present invention, via the second pattern opening, forming a thinned first base dielectric layer under the second pattern opening.

According to one embodiment of the present invention, forming a separator at each side of the scarifying layer upon the second pattern opening, and the separators are electrical isolated.

According to one embodiment of the present invention, the first polycrystalline silicon layer comprises an erase gate (EG) forming at the first pattern opening of the first base dielectric layer, and comprises a selective gate (SG) formed on the second pattern opening of the first base dielectric layer.

According to one embodiment of the present invention, according to the mask defined by the first and the second pattern openings region, removing the scarifying layer on the first base dielectric layer but not the first polycrystalline silicon layer.

According to one embodiment of the present invention, according to the mask defined by the first and the second pattern openings region, removing the first base dielectric layer outside the first polycrystalline silicon layer.

According to one embodiment of the present invention, defining a third pattern opening, defining the region outside the third pattern opening as a mask; and removing the second polycrystalline silicon layer outside the third pattern opening.

According to one embodiment of the present invention, a first dielectric layer is defined, the first dielectric layer comprising the first and the second base dielectric layers formed on the substrate.

According to one embodiment of the present invention, a second dielectric layer is defined, the second dielectric layer comprising the sidewall dielectric layer forming at two sides of the first polycrystalline silicon layer, and the covering dielectric layer formed on the second polycrystalline silicon layer, wherein the second dielectric layer covers the erase gate (EG) and the selective gate (SG).

This disclosure further discloses non-volatile memory unit includes a substrate, a first dielectric layer, an erase gate, a floating gate, a second dielectric layer and couple control gate.

The substrate has a source region and a drain region formed on the surface of the substrate, and the source region and the drain region are separated apart via a channel region. The first dielectric layer forms on the substrate and defines a first pattern opening along the depth direction on the first dielectric layer. The erase gate (EG) forms on the first dielectric layer and disposed upon the first pattern opening's projection along the depth direction. The floating gate (FG) forms on the first dielectric layer and near the erase gate. The selective gate (SG) forms on the first dielectric layer and near the floating gate, wherein the selective gate and the floating gate are disposed upon the channel region's projection along the depth direction. The second dielectric layer forms on the first dielectric layer and covers the erase gate and the selective gate, wherein the floating gate is disposed between two adjacent second dielectric layers. The coupled dielectric layer, formed on the erase gate, the floating gate, the selective gate and the second dielectric layer. The couple control gate (CG), formed on the coupled dielectric layer.

A first pattern opening of the first dielectric layer has a first thickness. The first dielectric layer below the projection of the floating gate has a second thickness, and the thickness of the first dielectric layer below the projection of the selective gate is defined as a third thickness. The first thickness is thicker than the second thickness, and the second thickness is thicker than the third thickness.

According to one embodiment of the present invention, the second dielectric layer is disposed between the two sides of the erase gate, and the second dielectric layer is formed from two sides of the first pattern opening away from the erase gate According to one embodiment of the present invention, the first dielectric layer has a second pattern opening, which defined by the selective gate (SG) along the depth direction.

According to one embodiment of the present invention, the first dielectric layer has a third pattern opening, which is defined by the source region along the depth direction.

According to one embodiment of the present invention, the selective gate (SG) further comprises a separator forming above the second pattern opening at each side of the selective gate (SG), and the separator is electrical isolated.

According to one embodiment of the present invention, the erase gate (EG) and the selective gate (SG) are formed in the damascene grooves, and the floating gate (FG) and the second dielectric layer are disposed between the erase gate (EG) and the selective gate (SG).

According to one embodiment of the present invention, the second dielectric layer that forming above the erase gate (EG) and the selective gate (SG) is covered by a covering dielectric layer and the covering dielectric layer is parallel to the first dielectric layer.

BRIEF DESCRIPTION OF THE DRAWINGS

This disclosure will become more fully understood from the detailed description given herein below for illustration only, and thus not limitative of this disclosure, wherein.

DETAILED DESCRIPTION

In the following description related to semiconductor processes, the terms common in the semiconductor processing field, such as the techniques of "formation of an oxidation layer", "lithography", "etching", "cleaning", "diffusion", "ion implantation", "chemical and physical vapor deposition", will not be described to avoid redundancy if these terms do not involve the technical features of the present invention.

Present invention disclosed a scale-down, reliable polycrystalline silicon to polycrystalline silicon, and characterize at erasing at the interface of polycrystalline silicon to source gate. Present invention is related to structure and manufacture method of a non-volatile memory unit of tri-polycrystalline silicon split gate.

Forming tri-polycrystalline silicon split gate according to conventional method, by operating two sides of the floating gate (FG) 23 and the couple control gate (CG) 24, to back and forth etch and define separators 153, 253. With the help of the depositing and flattening processes of the first polycrystalline silicon, and the scarifying layer 16 (such as silicon nitride, silicon oxidation, or the combination of the two) could formed into a damascene stable unit structure for erasing the pattern definitions of the erase gate (EG) 21 and the selective gate(FG)22.

In present invention a method for manufacturing a non-volatile memory unit (Si) is provided. More particularly, the non-volatile memory unit is tri-polycrystalline silicon split gate.

Figure 1A:
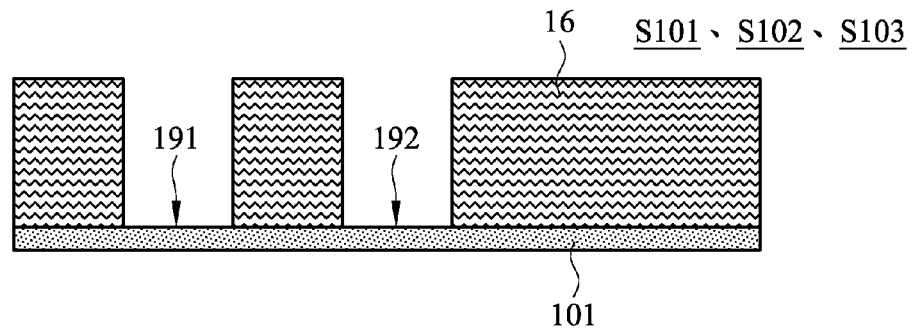
FIG. 1A-1N are cross-sectional views illustrating the non-volatile memory unit and the formation of the non-volatile memory unit according to the present invention.

Please refer to FIG. 1A. First of all, provides a substrate 10 (S101). The substrate 10 could be p-type or n-type substrate. Via some technique of the conventional semiconductor process, multiple layers are stacked on the substrate 10 to provide the semiconductor unit. Then, forms a first base dielectric layer 101 on the substrate 10, the first base dielectric layer 101 could be made of silicon oxide ($SiO_2$).

By the high-temperature thermal oxidation, the silicon substrate is oxidized to silicon oxide, which thickness is range from 100-200 nm.

Form a sacrificial layer 16 on the first base dielectric layer 101, and defines pattern on the photoresist via lithography mean. A first pattern opening 191 and a second pattern opening 192 are defined (S102). Thus, the sacrificial layer 16 is separated into sacrificial layers 16 along the horizontal direction. That is, the sacrificial layers 16 are formed on the first base dielectric layer 101 at the region outside the first pattern opening 191 and a second pattern opening 192.

As for the pattern opening, a photoresist layer or a mask layer is made in advance. By the means of lithography or with the combination of lithography and etching technique, the photoresist is patterned. Therefore, there will be no photoresist or mask within this region, photoresist or mask will only dispose outside this region. The vacant or opening at the photoresist or mask layer is called pattern opening.

In one of the embodiment of present invention, the thickness of the sacrificial layer 16 is range from 300-2000 nm, preferably 1000 nm. Sacrificial layer 16 could be a single silicon nitride (SiN) layer, nitride-oxide-silicon complex (SiON), or a multiple stacked dielectric layer. The multiple stacked dielectric layers could be oxide-nitride-oxide (ONO) or oxide-nitride-oxide-nitride (ONON).

Figure 1B:
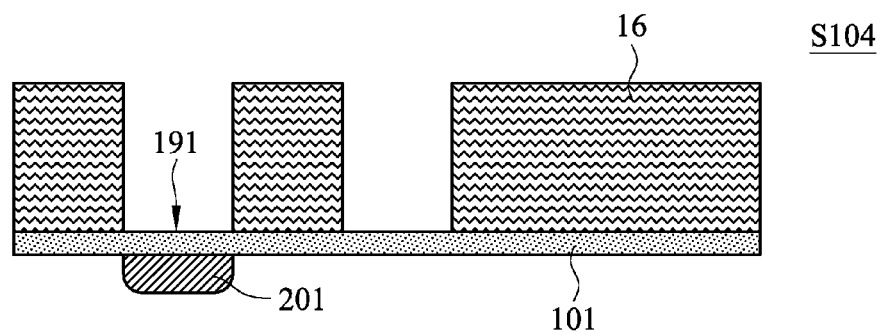

Please refer to FIG. 1B, shows the ion implantation performing step (S104). Performing ion implantation at the substrate 10 according to the first pattern opening 191, and the source region 201 is formed on the surface of the substrate 10. The source region 201 includes a diffusion region. For instance, one could apply ion implantation performing step on a p-type substrate for an N-well source region 201.

Figure 1C:
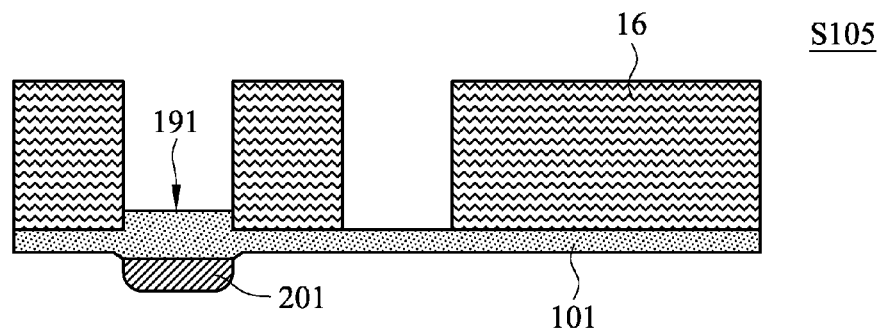

Then refer to FIG. 1C, for the source region 201 that made by the ion implanting process, selectively changing the thickness of the first base dielectric layer 101 (S105). Via the first pattern opening 191, forming a thickened first base dielectric layer 101 under the first pattern opening 191. For example, by the thermal oxidation the silicon oxide could be thickened. The silicon oxide could be thickened from 100-200 nm to 300-600 nm, preferably 450 nm. Others, the thickness of the first base dielectric layer 101 could also be thickened by applying a deposition process that disposed dielectric material on the first base dielectric layer 101.

Please refer to FIG. 1D selectively thicken the thickness of the first base dielectric layer 101 below the first pattern opening 191. Then preforms a non-selective wet etching process on the first base dielectric layer 101. The thickness of the first base dielectric layer 101 is changed and a selectively thinner the first base dielectric layer 101 is formed (S106). Via the second pattern opening 192, the thickness below the first base dielectric layer 101 below the second pattern opening 192 is thinner. For example, by the means of reactive ion etching (ME) or wet etching could remove the original the first base dielectric layer 101 and form a thinner dielectric layer. The dielectric layer will be thinner to 10-150 nm from 100-200 nm, In one embodiment, the first base dielectric layer 101 at the first pattern opening 191 has a first thickness 2501 that range between 300-600 nm. The first base dielectric layer 101 at the second pattern opening 192 has a third thickness 2503 that range between 10-150 nm. In addition, the first base dielectric layer 101 at the second pattern opening 192 has high-k dielectric material, such as nitride silicon oxide (SiON), zirconium oxide (HfO$_2$), or tantalum pentoxide (Ta$_2$O$_5$). Preferably, the first base dielectric layer 101 at the second pattern opening 192 maintains a thickness thinner than 20 nm, which is the thickness of equivalent oxide thickness, EOT). Except the above said steps, present invention could also include steps like annealing process or other the first base dielectric layer 101 defect reducing or removing process.

Particularly, selectively thicken the thickness of the first base dielectric layer 101 below the first pattern opening 191, and thinner the thickness of the first base dielectric layer 101 below the second pattern opening 192. Along the horizontal direction, the interval of the scarifying layer 16 on the first base dielectric layer 101 to from damascene grooves. The damascene grooves 17 are disposed upon the projections of the first pattern opening 191 and the second pattern opening 192.

Figure 1D:
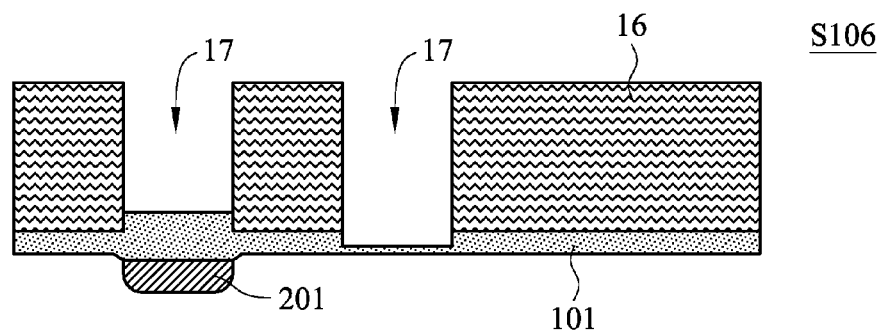
Figure 1E:
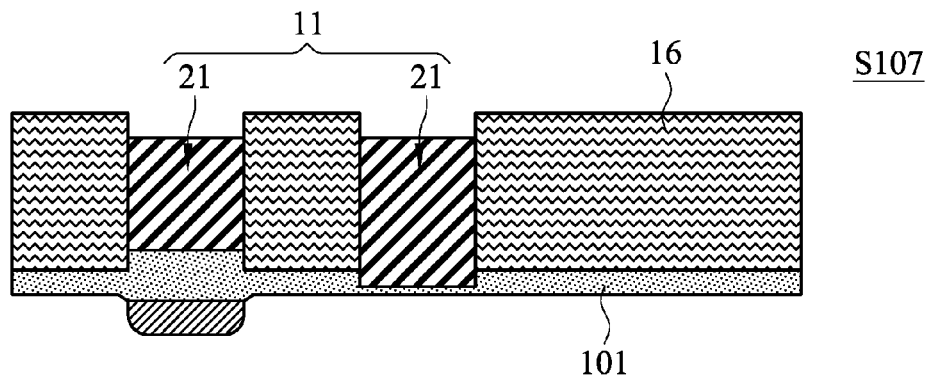

Please refer to FIG. 1E, forming a first polycrystalline silicon layer 11 above the first base dielectric layer 101 and the first polycrystalline silicon layer 11 is formed in the damascene grooves 17 (S107) The interval of the scarifying layer 16 on the first base dielectric layer 101 to from damascene grooves. The damascene grooves 17 are disposed upon the projections of the first pattern opening 191 and the second pattern opening 192. The first polycrystalline silicon layer 11 includes the erase gate (EG) 21 of the first polycrystalline silicon layer 11 at the first pattern opening 191 of the first base dielectric layer 101, and the selective gate (SG) 22 of the first polycrystalline silicon layer 11 at the first base dielectric layer 101. That is, the first polycrystalline silicon layer 11 includes the erase gate (EG) 21 and selective gate (SG) 22.

In addition, forming an erase gate (EG) 21 above the first pattern opening 191 of the first base dielectric layer 101, and forming a the selective gate (SG) 22 above the second pattern opening 192 of the first base dielectric layer 101. Wherein, the thinner the transistor dielectric layer 292 of the selective gate (SG) 22 is disposed under the second pattern opening 192 the first base dielectric layer 101. For example, after disposing the poly-Si, the poly crystalline silicon is etched to a predetermined thickness to form into the erase gate (EG) 21 and selective gate (SG) 22.

Figure 1F:
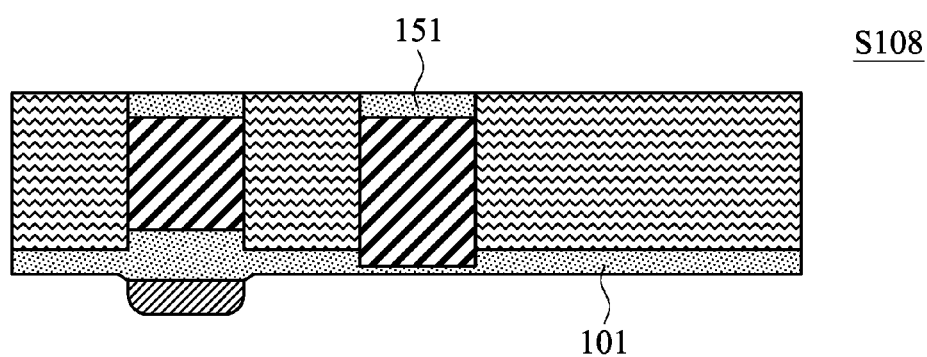

Please refer to FIG. 1F. First of all, forms a covering dielectric layer 151 (S108). By the means of lithography, at the photoresist outside the damascene grooves 17 is defined as a mask, and a covering dielectric layer 151 is formed on the first polycrystalline silicon layer 11 within the damascene grooves. That is, the covering dielectric layer 151 is formed on the erase gate (EG) 21 and selective gate (SG) 22. For instance, by the mean of chemical vapor deposition (CVD), the covering dielectric layer 151 is covered and etched to a predetermined thickness. Or by the means of thermal oxidation, the first polycrystalline silicon layer 11 could form into the covering dielectric layer 151.

Figure 1G:
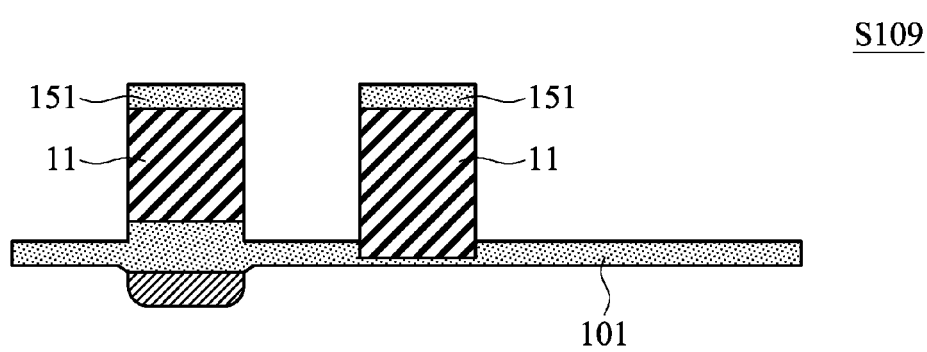

Please refer to FIG. 1G, removing the scarifying layer 16 (S109). By the means of lithography, the photoresist upon the damascene grooves 17 is defined as a mask covering dielectric layer 151. The scarifying layer 16 of the first base dielectric layer 101 outside the damascene grooves 17 is removed. That is, the scarifying layer 16 of the first base dielectric layer 101 outside the erase gate (EG) 21 and selective gate (SG) 22 along the horizontal direction is removed. Therefore, the first polycrystalline silicon layer 11 and the covering dielectric layer 151 are mutually apart from each other along the horizontal direction. The covering dielectric layer 151, the erase gate (EG) 21 that covered by the covering dielectric layer 151, and the selective gate (SG) 22 that covered by the covering dielectric layer 151 do not intersect with each other. For example, by reactive ion etching or by wet etching the silicon nitride of the scarifying layer 16 is removed, and the covering dielectric layer 151 is not affected.

Figure 1H:
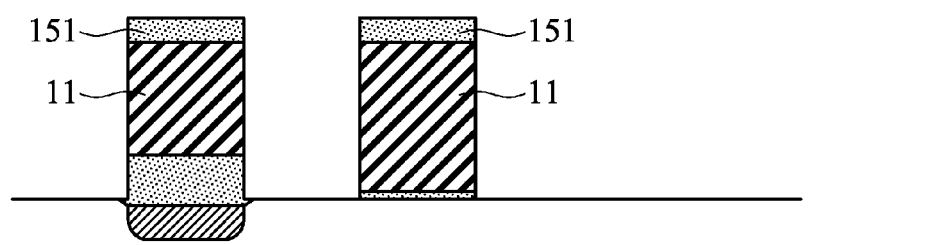

Please refer to FIG. 1H, the first base dielectric layer 101 is removed (S110). By the means of lithography, the photoresist upon the damascene grooves 17 is defined as a mask, and the first base dielectric layer 101 outside damascene grooves 17 is removed. That is, the first base dielectric layer 101 on the erase gate (EG) 21 and selective gate (SG) 22 along the horizontal direction is removed. For example, by reactive ion etching or by wet etching the silicon nitride of the first base dielectric layer 101 is removed, and the covering dielectric layer 151 is not affected.

Figure 1I:
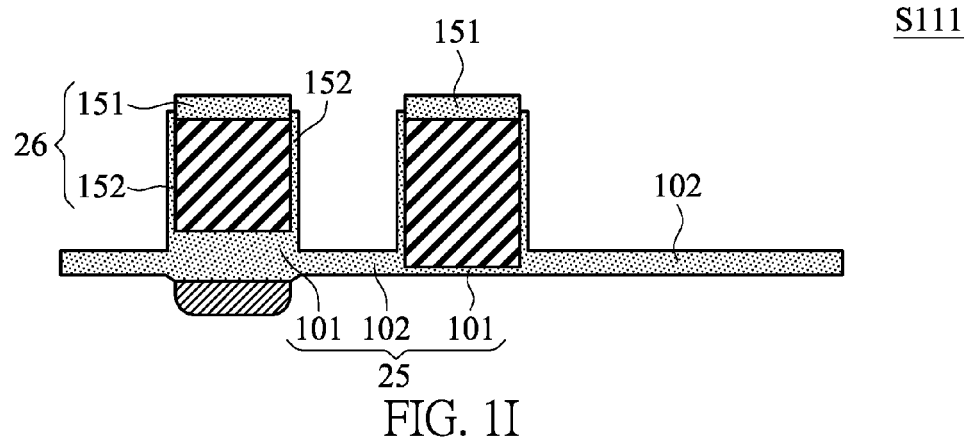

Please refer to FIG. 1I, forming a second base dielectric layer 102 and a sidewall dielectric layer 152 (S111). The substrate 10 is oxidized to form a second base dielectric layer 102. The erase gate (EG) and the selective gate (SG) oxidized along the horizontal direction to form the sidewall dielectric layer 152. Therefore, the first polycrystalline silicon layer 11, covering dielectric layer 151 and the sidewall dielectric layer 152 are spaced apart along the horizontal direction. For example, the silicon oxide could be disposed via chemical vapor deposition (CVD), or by high-temperature thermal oxidation the silicon substrate could form into silicon oxide.

Particularly, the sidewall dielectric layer 152 is disposed above the first pattern opening 191, and the sidewall dielectric layer 152 is formed from two sides of the first pattern opening 191 away from the erase gate (EG) 21. The sidewall dielectric layer 152 is formed at two sides of the erase gate (EG) 21. The width of the first pattern opening 191 along the horizontal direction is equal to the width of the erase gate (EG) 21. In other way of speaking, only the erase gate (EG) 21 is disposed within the interval two adjacent scarifying layers at the first pattern opening 191.

Figure 1J:
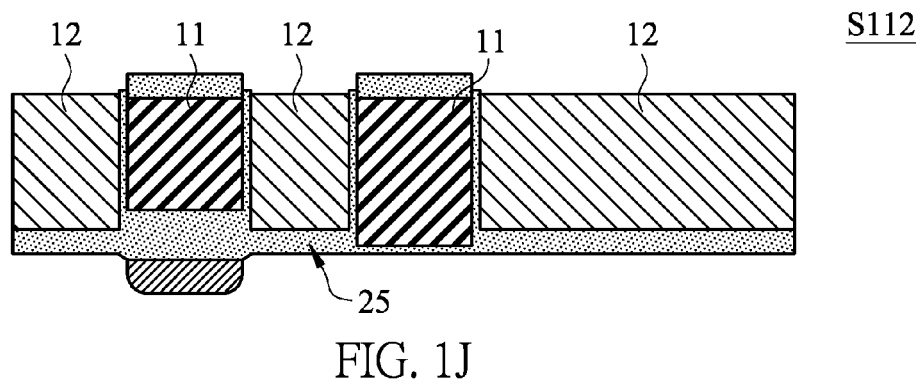
Figure 1K:
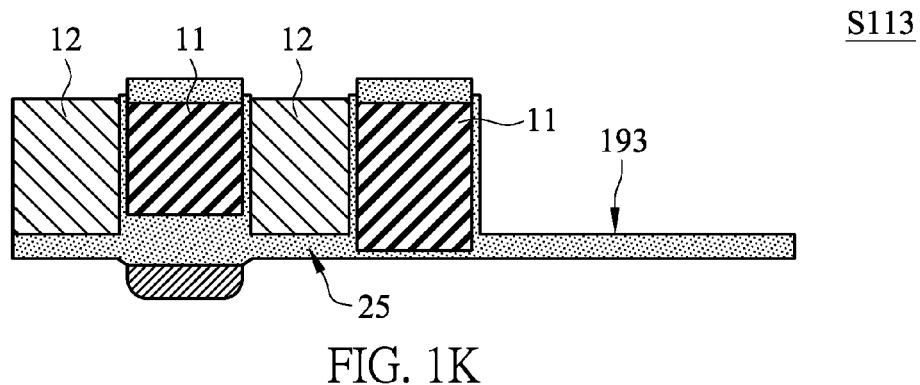

Please refer to FIG. 1J, a second base dielectric layer 102 is formed. The second base dielectric layer 102 is filled into the interval along horizontal direction formed by the first polycrystalline silicon layer 11 and the sidewall dielectric layer 152 (S 112). By the means of lithography, the first polycrystalline silicon layer 11, the covering dielectric layer 151 and the sidewall dielectric layer 152 are defined as mask. The second polycrystalline silicon layer 12 is formed on the second base dielectric layer 102, which creates intervals along horizontal direction. The second polycrystalline silicon layer 12 includes the second polycrystalline silicon layer 12 of the second base dielectric layer 102 outside the first pattern opening 191 and second pattern opening 192. Wherein, the second polycrystalline silicon layer 12 between the erase gate (EG) 21 and selective gate (SG) 22 is the floating gate (FG) 23 of the second polycrystalline silicon layer 12. For example, after disposing the poly-Si, the poly crystalline silicon is etched to a predetermined thickness. Furthermore, by the means of lithography, the second polycrystalline silicon layer 12 could form into independent floating gate block, Please refer to FIG. 1K, by the means of lithography, a pattern is defined at the photoresist and the third pattern opening 193 is formed on the second polycrystalline silicon layer 12. By the means of lithography, the patterned photoresist could be used as a mask to remove the second polycrystalline silicon layer 12 at the third pattern opening 193 along the depth direction, and the second polycrystalline silicon layer 12 above the projection of the drain region 202. That is, the second polycrystalline silicon layer 12 nears the erase gate (EG) 21 and away the selective gate (SG) 22 is removed. For example, by reactive ion etching or by wet etching the silicon nitride of the second polycrystalline silicon layer 12 is removed, and above said layers are not affected.

Figure 1L:
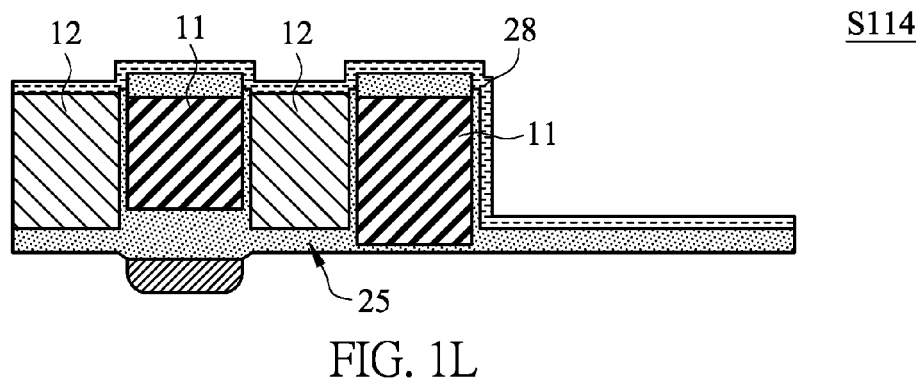

Please refer to FIG. 1L, a coupled dielectric layer 28 is formed on the second polycrystalline silicon layer 12, the covering dielectric layer 151 and sidewall dielectric layer 152 (S114). The coupled dielectric layer 28 covers the above said the second polycrystalline silicon layer 12, the covering dielectric layer 151 and sidewall dielectric layer 152. For instance, by the mean of chemical vapor deposition (CVD), the stacked oxide-nitride-oxide (ONO) layer or the high-k dielectric material is disposed.

Figure 1M:
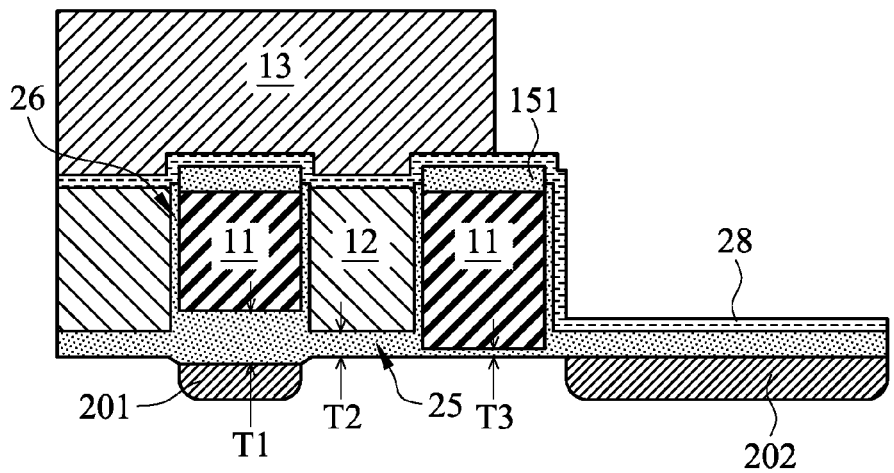

Please refer to FIG. 1M, a third polycrystalline silicon layer 13 is selectively formed on the coupled dielectric layer 28 (S115). By the means of lithography, the patterned photoresist could be used as a mask to dispose the third polycrystalline silicon layer 13. Then, formed into the couple control gate (CG) 24 of third polycrystalline silicon layer 13 and partially covered the coupled dielectric layer 28. Then, performs ion implantation according to the third pattern opening 193. A drain region 202 will be formed at the second base dielectric layer 102 and the coupled dielectric layer 28 overlapped region along the depth direction. Only portion of the second base dielectric layer 102 and the coupled dielectric layer 28 is stacked above the drain region 202. A channel region 203 is formed between the source region 201 and the drain region 202.

Finally, according to the method of the non-volatile memory unit (Si), the memory unit 2 is made in sequence.

Figure 1N:
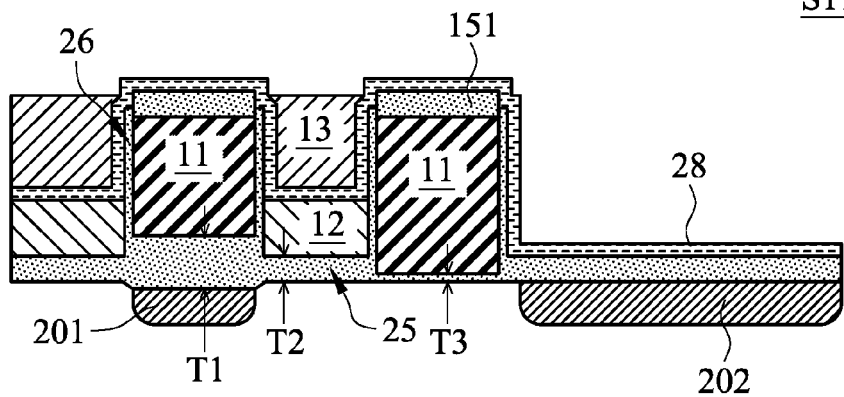

Other, please refer to FIG. 1J, By the means of lithography, the first polycrystalline silicon layer 11 and the sidewall dielectric layer 152 region is defined as a mask, and the second polycrystalline silicon layer 12 is filled at the interval between the first polycrystalline silicon layer 11 and the sidewall dielectric layer 152 along the horizontal direction. The second polycrystalline silicon layer 12 is etched to a predetermined thickness. The third polycrystalline silicon layer 13 is disposed at the coupled dielectric layer 28. Similarly, the third polycrystalline silicon layer 13 is etched to a predetermined thickness and formed into a couple control gate (CG) 24 that could independently control. Please refer to FIG. 1N, to finish the non-volatile memory unit 20.

More importantly, at the step S111 of "forming a second base dielectric layer 102 and the sidewall dielectric layer 152", the present invention further defines a first dielectric layer 25 and a second dielectric layer 26. The first dielectric layer 25 and the second dielectric layer 26 respectively represent horizontal and vertical direction dielectric layers that formed in different steps. First, the first dielectric layer 25 includes the first base dielectric layer 101 formed on the substrate 10 and the second base dielectric layer 102 formed on the substrate 10. The second dielectric layer 26 includes the sidewall dielectric layer 152 of the first base dielectric layer 101, and the covering dielectric layer 151. That is, the second dielectric layer 26 on the first dielectric layer 25 covers the first polycrystalline silicon layer 11.

In addition, a tunneling dielectric layer 291 is defined between the erase gate (EG)21 of the first base dielectric layer 11 and the sidewall dielectric layer 152 of the floating gate (FG) 23 the second base dielectric layer 21. A transistor dielectric layer 292 is defined being disposed under the selective gate (SG) 22 of the first base dielectric layer 101. A floating gate dielectric layer 293 is defined being disposed under the floating gate (FG) 23 of the second polycrystalline silicon layer of the second first base dielectric layer 102.

In other word, the first dielectric layer is defined, which comprises the transistor dielectric layer 292 of the first base dielectric layer 101 and floating gate dielectric layer 293 of the second base dielectric layer 10. Others, the second dielectric layer comprises the tunneling dielectric layer 291 of the sidewall dielectric layer 152 and the covering dielectric layer 151.

In one embodiment, along the depth direction the thickness of the first dielectric layer 25 below the projection of the floating gate (FG) is defined as a second thickness. The second thickness is range from 70 nm to 150 nm, preferably about 100 nm. Except the above said steps, present invention could also include steps like annealing process or other the first base dielectric layer 101 defect reducing or removing process.

Others, according to the method of the non-volatile memory unit (Si), the memory unit 2, 20 are made. Dispose the first polycrystalline silicon layer 11 (S107) to form the erase gate (EG) 21 and the selective gate (SG) 22. Dispose the second polycrystalline silicon layer 12 (S112) to form the floating gate (FG) 23 of the second polycrystalline silicon layer 12. Dispose the third polycrystalline silicon layer 13 (S115) to form the couple control gate (CG) 24 of the third polycrystalline silicon layer 13.

As for damascene, at step S106, the damascene grooves 17 could fill in the first polycrystalline silicon layer 11 and form a silicon dioxide ($SiO_2$) or Silicon nitride ($Si_3N_4$) layer as a hard mask. In the later process, such as removing photoresist, the hard mask could avoid the dielectric layer being destroyed during the etching process. Furthermore, part of the structure could apply the buried hard mask technique, with an etching stop layer or hard mask design could eliminate the alignment error during the structure constructing process.

Removing the sacrificial layer 16, then by back-filling and back-etching the patterned second polycrystalline silicon layer 12, a floating gate (FG) 23 is formed. Before disposing every selective gate (SG) 22 and the floating gate (FG) 23 poly crystalline silicon (S112), the transistor dielectric layer 292 of the selective gate (SG) 22 and the tunneling dielectric layer 291 of the erase gate (EG) 21 are independently manufactured (S111). In the step (S111) of disposing the first dielectric layer 25 and the sidewall dielectric layer 152, at the first dielectric layer 25 below the projection of the floating gate (FG) 23 is floating gate dielectric layer 293. At the first dielectric layer 25 below the projection of the selective gate (SG) is the transistor dielectric layer 292 of the selective gate (SG) 22. The sidewall dielectric layer 152 is disposed between the erase gate (EG) 21 and the floating gate (FG) 23, which the tunneling dielectric layer 291 of the erase gate (EG) 21.

Figure 2A:
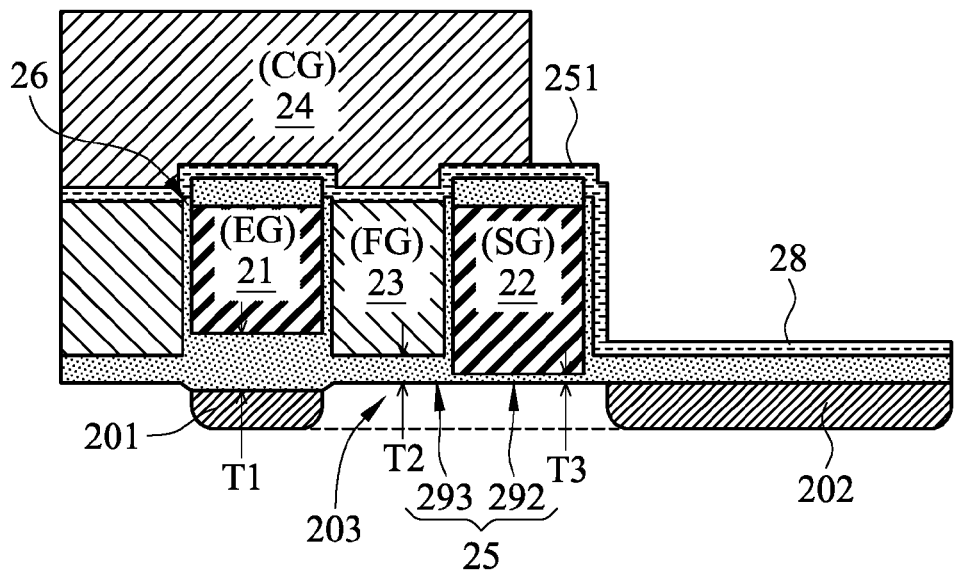
FIG. 2A-2B are cross-sectional 1 views of the non-volatile memory unit in accordance the present invention.
Figure 2B:
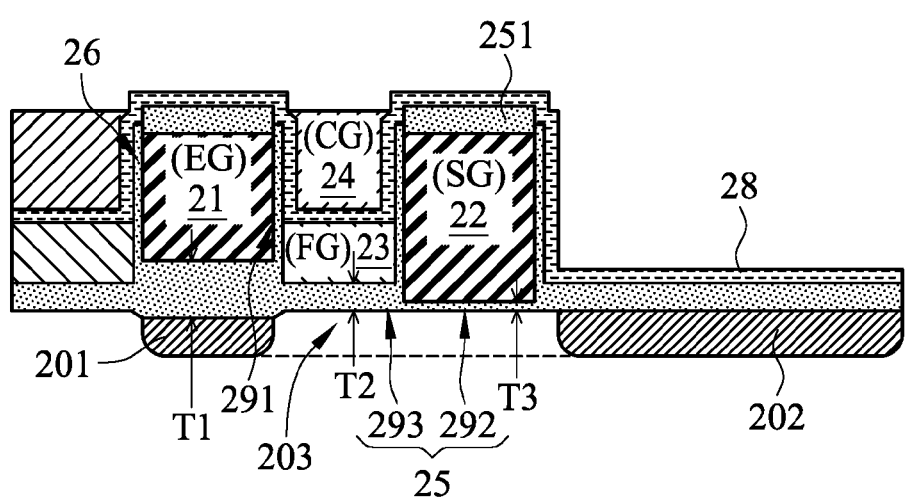

Please refer to FIG. 2A, present invention is related to a non-volatile memory unit 2, particularly to a non-volatile memory unit 2 of tri-polycrystalline silicon split gate. The non-volatile memory unit 2 includes a substrate 10, which at the surface of the substrate 10 has a source region 201 and a drain region 202 that separated by a channel region 203. Then, the first dielectric layer 25 is formed on the substrate 10, which includes a first pattern opening 191. The first pattern opening 191 could define the source region 201 along the depth direction.

Forming an erase gate (EG) 21 on the first dielectric layer 25, and the erase gate (EG) 21 forming at the projection above the first pattern opening 191 along the depth direction. At the step S107 of forming the first polycrystalline silicon layer 11, the first polycrystalline silicon layer 11 includes the erase gate (EG) 21 forming above the projection of the first pattern opening 191 of the first base dielectric layer 101. At the step S111 of forming the first dielectric layer 25 and the second dielectric layer 26, the first dielectric layer 25 includes the first base dielectric layer 101 and the second base dielectric layer 102.

A floating gate (FG) 23 is formed on the first dielectric layer 25, and the floating gate (FG) 23 is near the erase gate (EG) 21. At the step S112 of forming the second polycrystalline silicon layer 12, part of the second polycrystalline silicon layer 12 is disposed between the erase gate (EG) 21 and the selective gate (SG) 22. By the means of lithography, the second polycrystalline silicon layer 12 forms an independent region of the floating gate (FG) 23.

Forming a selective gate (SG) 22 on the first dielectric layer 25, the selective gate (SG) 22 is adjacent to the floating gate (FG) 23. The selective gate (SG) 22 and floating gate (FG) 23 are disposed above the projection of the channel region 203. At the step S107 of forming the first polycrystalline silicon layer 11, the first polycrystalline silicon layer 11 includes forming the selective gate (SG) 22 at the second pattern opening 192 on the first base dielectric layer 101. At the step S111 of forming the first dielectric layer 25 and the second dielectric layer 26, the first dielectric layer 25 includes the first base dielectric layer 101 and the second base dielectric layer 102.

The second dielectric layer 26 forms a sidewall dielectric layer 152 of the polycrystalline silicon on the first dielectric layer 25, which is disposed between the erase gate (EG) 21 and the floating gate (FG), and between the first dielectric layer 25 and the second dielectric layer 26. At the step S111 of forming the first dielectric layer 25 and the second dielectric layer 26, the second dielectric layer 26 is disposed on the erase gate (EG) 21, selective gate (SG) 22 and the covering dielectric layer 251. Practically, the second dielectric layer 26 is formed from along direction of two sides of the first pattern opening, 191 and disposing at the two sides of the erase gate (EG) 21 to a second dielectric layer 26. The width of the first pattern opening 191 along the horizontal direction is equal to the width of the erase gate (EG) 21. In other way of speaking, only the erase gate (EG) 21 is disposed within the interval two adjacent scarifying layers at the first pattern opening 191.

Accordingly, a coupled dielectric layer 28 is formed on the erase gate (EG) 21, floating gate (FG) 23, selective gate (SG) 22 and sidewall dielectric layer 152. At the step S114 of forming the coupled dielectric layer 28, the coupled dielectric layer 28 covers and forms on the top of the above said layers. Please refer to 1M, the coupled dielectric layer 28 is formed into a continuous concave and convex shape and covers the second dielectric layer 26, the erase gate (EG) 21, the selective gate (SG) 22 and the floating gate (FG) 23. Furthermore, as for FIG. 1N, contrast to the erase gate (EG) 21 and the selective gate (SG) 22, the coupled dielectric layer 28 of the floating gate (FG) 23 is relatively near the first dielectric layer 25 along the depth direction. Otherwise, the coupled dielectric layer 28 is covered along the first dielectric layer 25 and the second dielectric layer 26, so it is disposed on first dielectric layer 25 and the above the third pattern opening 193 along the depth direction. Also, the coupled dielectric layer 28 is close to a side of the selective gate (SG) 22 of the second dielectric layer 26 of the third pattern opening 193.

Last but not least, the couple control gate (CG) 24 is formed on the coupled dielectric layer 28. Therefore, in present invention the first pattern opening 191 of the first dielectric layer 25 has a first thickness 2501, along the depth direction and below the projection of the floating gate (FG)

23 of the first dielectric layer 25 is defined as a second thickness 2502, and along the depth direction below the projection of the selective gate (SG) 22 is defined as a third thickness 2503. The first thickness 2501 is thicker than the second thickness 2502, and the second thickness is thicker than the third thickness 2503.

Furthermore, the second dielectric layer 26 is disposed between the erase gate (EG) 21 and the floating gate (FG) 23, thus is disposed at the tunneling dielectric layer 291 of the erase gate (EG) 21. Others, the first dielectric layer 25 is disposed under the projection of the selective gate (SG) 22, that is, the transistor dielectric layer 292 r of the selective gate (SG) 22. The first dielectric layer 25 is disposed under the projection of the floating gate (FG) 23, that is, the floating gate dielectric layer 293 of the floating gate (FG) 23.

In one embodiment, the first dielectric layer 25 has a first pattern opening 191, which is defined by the source region 201 along the depth direction. The first dielectric layer 25 has a second pattern opening 192, which defined by the selective gate (SG) 22 along the depth direction. The first dielectric layer 25 has a third pattern opening 193, which is defined by the source region 202 along the depth direction.

Figure 3A:
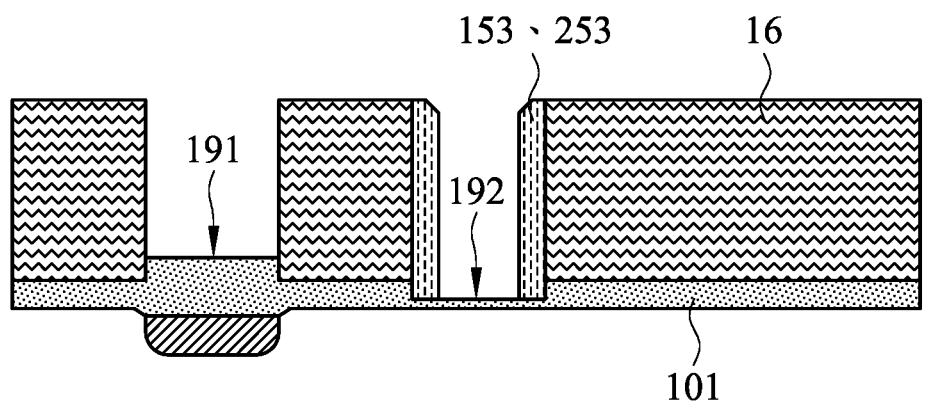
FIG. 3A-3B are cross-sectional views of the separator between the non-volatile memory units in accordance the present invention.

Please refer to FIG. 3A, in one embodiment, at two sides of the sidewall of the sacrificial layer 16 above the second pattern opening 192, after selectively thinner the first base dielectric layer 101 (step S106), separators 153 are formed. The separators 153 are electrical isolated. Otherwise, silicon nitride and silicon oxide are continuous disposing and dry/wet etching. A necessary lithography process is applied, before disposing the polycrystalline silicon between the selective gate (SG) 22 and the floating gate 23 (FG) (step S112), to formed ON or ONO separators 153 between the selective gate (SG) 22 and the floating gate 23 (FG). To realize the table insulation between the selective gate (SG) 22 and the floating gate 23 (FG) and avoid the dilemma of interfere.

Adding process integration of silicon nitride and silicon oxide, during forming the erase gate (EG) 21 and the selective gate (SG) 22, the selective gate damascene (SG WL) selectively formed ON or ONO separators 153, in order to gain the stable insulation between the floating gate 23 (FG) to selective gate damascene (SG WL).

On the other hand, the above said initial the sacrificial layer 16 could be made of the combination of the sacrificial layer 16 and the first polycrystalline silicon layer. After the later on removal of the sacrificial layer 16, the polycrystalline silicon become part of the damascene hard mask and as a floating gate 23 (FG). After removing the sacrificial layer 16, no need for addition back-filling or planarization of the polycrystalline silicon of the floating gate 23 (FG).

Thus, in order to independently produce the tunneling dielectric layer 291 of the erase gate (EG) 21 and the transistor dielectric layer 292 of the selective gate (SG) 22, one of the remove and refilled polycrystalline silicon gate (normal SG) could be use and select for inserting extra polycrystalline silicon refill and flattening process. Continuous disposing and dry/wet etching of the silicon nitride and silicon oxide is contributed to erase the substrate of the erase gate (EG) 21 and the selective gate (SG) 22. The tunneling dielectric layer 291 and the transistor dielectric layer 292 are selectively connected.

The non-volatile memory arrays 2, 20 of the present invention program a low power hot electron injection programming, and a high reliability poly silicon and poly silicon tunneling and erasing, and low voltage logically compatible character. By rapidly program the logically compatible oxide layer of the selective gate damascene (SG WL), and the programed voltage and current could be precisely control. By pre-forming the tunneling dielectric layer 291 and the pad separators of ON or ONO, the erasing injecting terminal of the floating gate 23 (FG) has an undestroyed and fine surface therefore provides a highly reliability erasing.

More important, since the present invention will be integrated with other advanced logic compatibility to scale down in size, the programing voltage will be easily reached. The transistor oxide layer of the selective gate damascene could integrate to allow the maximum current output. The above non-volatile memory unit of split gate is made of damascene process, and could be used with conventional flattening unit structure such FINFET. There will be no difficult for additional scaling down.

The auxiliary transistor is hot electron injected via nominal channel; the programmed of the selective gate (SG) is program via low current to the non-volatile memory unit 2 (via conventional stack gate ETOX). The non-volatile memory units 2, 20, 3, 4 of the present invention could be erased via the erase gate (EG) 21 and/or the diffusion of the source region 201.

According to some electrical need of some application, such as EEPROM. The erase gate (EG) 21 and the couple control gate (CG) 24 could be physically or electrically connected. Or the couple control gate (CG) 24 could replace the erase gate (EG) 21 and enhances the coupling ratio of low voltage operation of the floating gate (FG) 23.

Figure 4A:
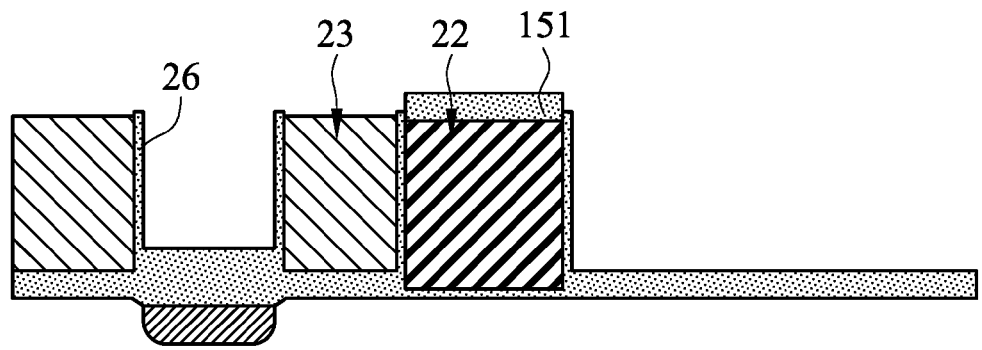
FIG. 4A-4B are cross-sectional views of the non-volatile memory unit in accordance the present invention.
Figure 4B:
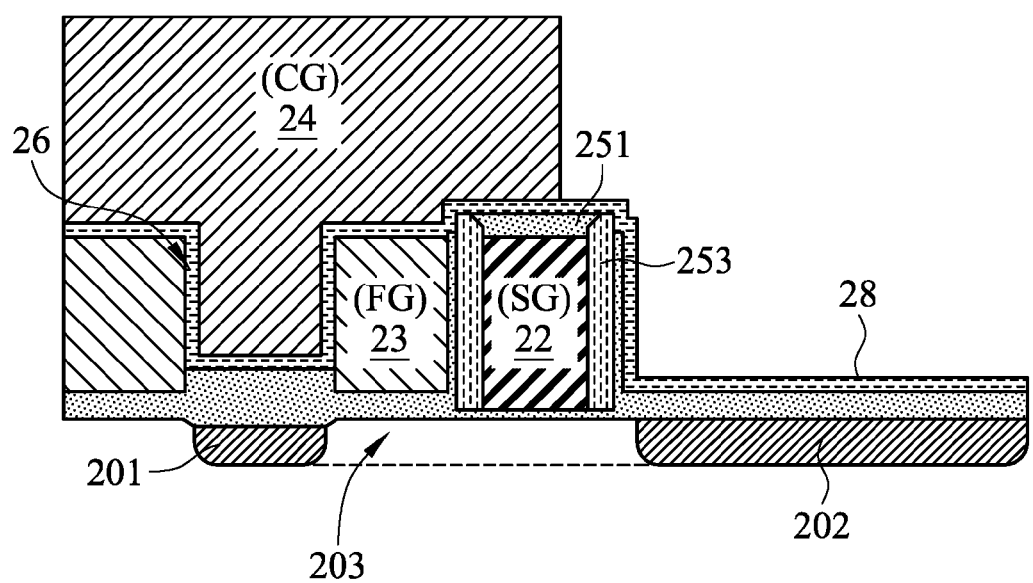

Please refer to FIG. 1J, at the step S112 of disposing, back-etching and flattening the second polycrystalline silicon layer (polycrystalline silicon). Then, refer to FIG. 4A, erase gate (EG) 21 of the first polycrystalline silicon layer 11 that damascene on the first base dielectric layer 101 is selectively etched and removed. And as shown in FIG. 4B, which is the final structure unit of the present invention. The couple control gate (CG) 24 and the coupled dielectric layer 28 replace the interface of the erase gate (EG) 21, and the coupling ratio is obvious increase. Therefore, contrast to convention erasing voltage these arrangement is more efficiency.

Figure 3B:
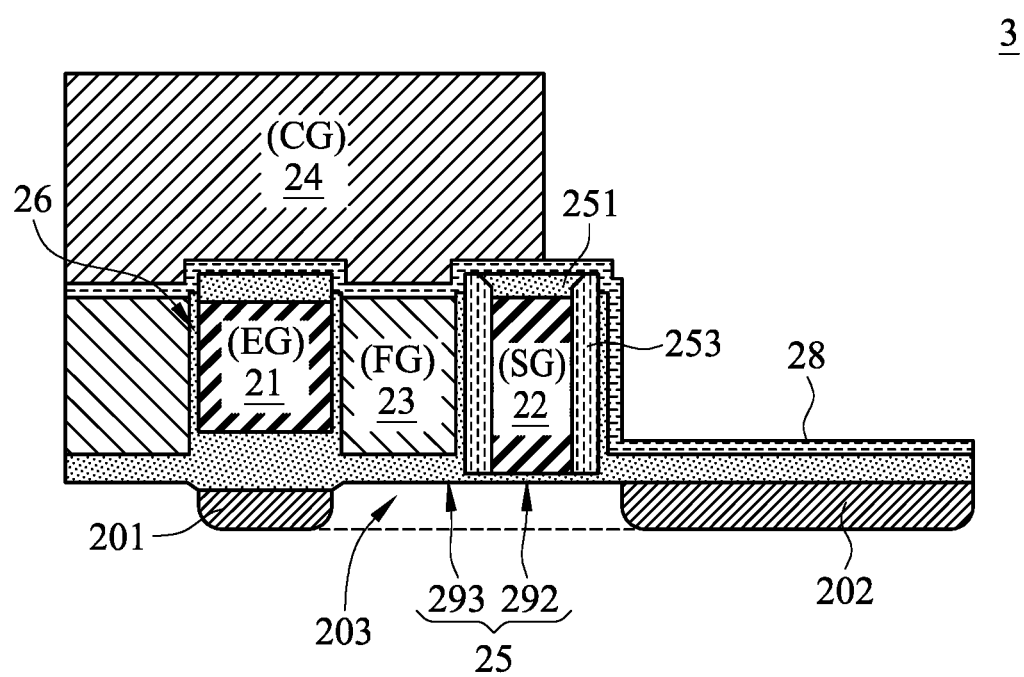

The present invention provide a stable insulating layer between the between the selective gate (SG) 22 and the floating gate 23 (FG). The sidewall of the polycrystalline silicon is usually formed by ON or the combination of ONO. By the anisotropic etch of the external oxide layer and selectively removes the silicon nitride of the damascene region, to easily form the disposing ONO film. Please refer to FIG. 3B, are the damascene selective ONO separators of the selective gate (SG) 22 and the final structure is shown in the figure.

During the electron erasing period, the trapping of the tunneling dielectric layer 291 is considered as the major reason of narrowing the operating cycle and the decaying the withstand voltage. Usually, the silicon oxide growing at high temperature or CVD of silicon hydride ($SiH_4$) reaction could form the oxide layer both are fine tunneling dielectric layer 291. By depicting the content of the nitride in the silicon oxide, the silicon oxide is processed by the nitrogen oxide (NO) or the nitrous oxide ($N_2O$), in order to reduce the trap density at the interface of the silicon oxide and silicon oxide-silicon oxide.

Silicon oxide contains excess nitride will become serious electron trap, in some extreme cases such as SONOS. Film with abundance nitride could be used as a storage media of the electrons but not for obvious tunneling route. Therefore, the content of the nitride of the silicon oxide has to be control. In the present invention, the major advantage of the sequence in the process is that the transistor dielectric layer 292 of the selective gate (SG) 22 and the tunneling dielectric layer 291 of the erase gate (EG) 21 could be independently manufactured.

Please refer to FIG. 1D, the high-k dielectric material is used in the transistor of the selective gate (SG) 22 (includes nitride-oxide-silicon complex.) Since logic circuit and the technique node of the major data stream scale down, after removing the scarifying layer 16, by using high-k dielectric material such as $HfO_2$-$Ta_2O_5$ for dielectric of selective gate (SG) 22. Although the high-k dielectric material has narrowband and could improve the tunneling effect of the sidewall dielectric layer 152, the tunneling effect of the sidewall dielectric layer 152 of the second dielectric 26 could not independently adjust. The advantage of manufacturing the sidewall dielectric layer 152 of the second dielectric 26 and the transistor dielectric layer 292 of the selective gate (SG) 22 independently is that the nitride-oxide-silicon complex (SiON) could be used as the dielectric layer of the selective gate (SG) 22. By the means of the conventional method, the nitric oxide (NO) and the nitrous oxide ($N_2O$) of the tunneling dielectric layer 291 is improved, in order to control the nitrous content in the nitride-oxide-silicon complex.

Figure 5:
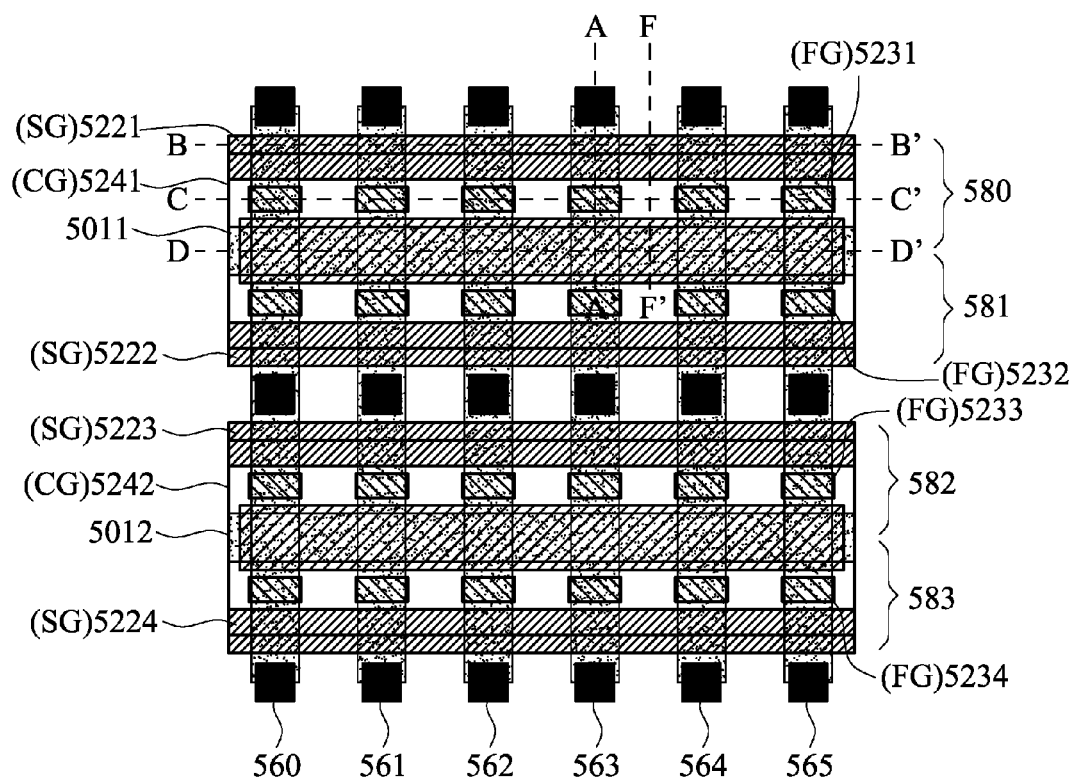
FIG. 5 is a schematic view illustrating the non-volatile memory array according to the present invention.

Please refer to FIG. 5, which shows a diagrammatic view illustrating the non-volatile memory array 5 that configured by non-volatile memory units 2, 20, 3 and 4 according to the present invention. Only part of the top surface of the non-volatile memory array 5 is shown in the top view. The non-volatile memory array 5 has several non-volatile memory units 2, 20, 3 and 4 that are arranged as a chess board pattern. More precisely, non-volatile memory units 2, 20, 3 and 4 are arranged along first direction X and second direction Y which is mutual vertical to each other. There are 24 sets of non-volatile memory units 2, 20, 3 and 4 shown in FIG. 5, 6 sets are arranged in first direction X and 4 sets are arranged in second direction Y.

Accordingly, selective gate (SG) 22 of each row is connected via the first direction X, and is electrical connected as shown in 5221, 5222, 5223 and 5224. The source region 201, shared each two adjacent columns of non-volatile memory units 2, 20, 3 and 4. As shown as 5011 and 5012, the shared source regions 201 at the same row connected via the first direction X and are electrical connected. As shown as 5241 and 5242, the shared couple control gate (CG) of each adjacent non-volatile memory units in every column via the first direction X and are electrical connected.

As shown as bit lines 560, 561, 562, 563 and 564, the source regions 202 at each column is connected through a through hole via a metal layer along the second direction Y are electrical connected. These floating gates (FG) 23 are independent and do not intersect with each other. The floating gates (FG) 23 are electrical insulated and do no connect with outside, in order to store the storing status of the non-volatile memory units 2, 20, 3 and 4. As shown in 5231, 5232, 5233 and 5234, the word lines 580, 581, 582 and 583 of the non-volatile memory units 2, 20, 3 and 4 are disposed correspondingly to each the floating gates (FG) 23.

Figure 6:
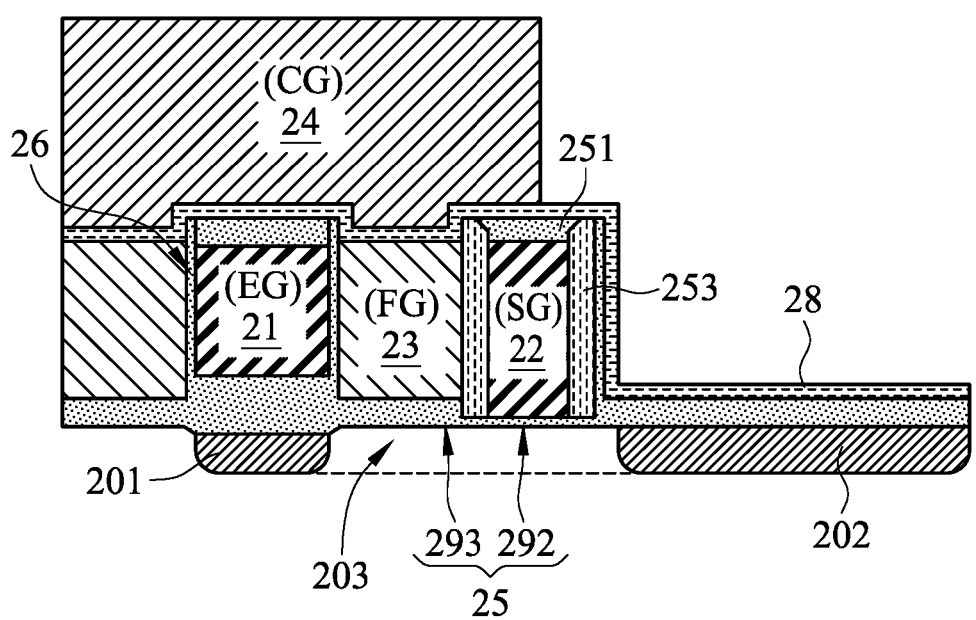
FIG. 6A-6E are cross-sectional views of a non-volatile memory array according to the present invention.
Figure 6B:
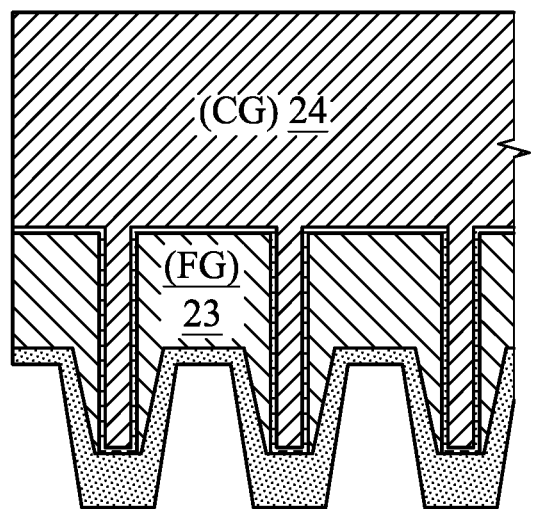
Figure 6C:
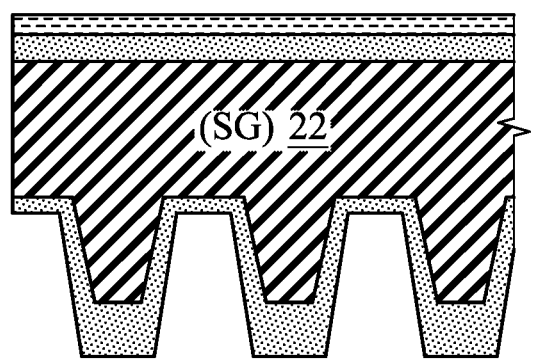
Figure 6D:
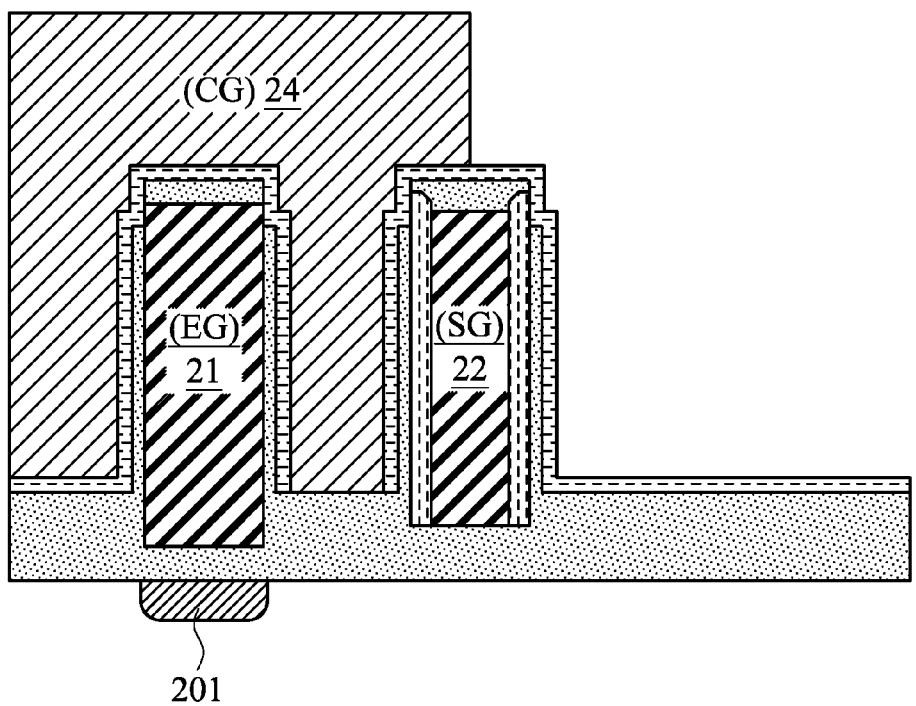
Figure 6E:
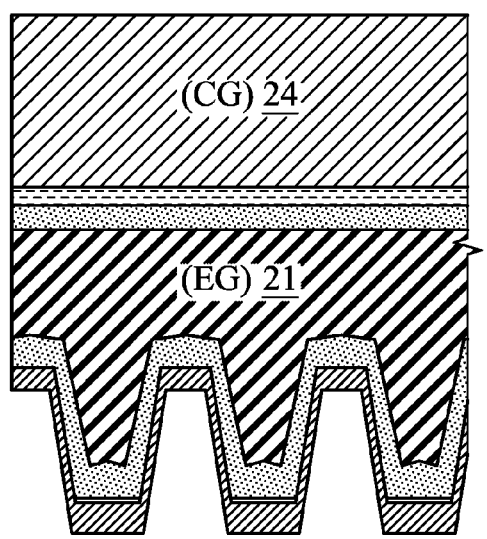

In one embodiment, please refer to FIG. 6A to FIG. 6E are the diagrammatic cross sectional views along different the cutting lines of present invention that applied at the bottom structure of the FinFET. The non-volatile memory units 3 that comprise separators 153 and 253 could configure the non-volatile memory array. Furthermore, FIG. 6A shows the cross sectional views along the cutting lines A-A'. FIG. 6B shows the cross sectional views along the cutting lines C-C'. FIG. 6C shows the cross sectional views along the cutting lines B-B'. FIG. 6D shows the cross sectional views along the cutting lines F-F'. FIG. 6E shows the cross sectional views along the cutting lines D-D'.

Below will explain the detail the operation method of the non-volatile memory array 5 configured by non-volatile memory units 2, 20, 3 and 4. As for non-volatile memory array structure of the present invention, partial erase operation could be applied at any two adjacent rows of the shared source region 201. For example, erasing the word lines 582-583 of non-volatile memory units 2, 20, 3 and 4, more precisely erasing the two rows where the word lines 582-583 are disposed. At the shared source region 201, a 6V voltage is applied, and a negative 9V voltage is applied at the couple control gate (CG) 5242. Therefore, the electrons are removed from the floating gate (FG) 23 and tunneling to the source region 201. Then the equivalent polarity of these two rows of the floating gate (FG) 5233, 5234 will be positive voltage.

While undergoes an operation of writing "0", such as undergoes an operation of writing "0" at the word lines 582 of the non-volatile memory units 2, 20, 3 and 4. For example, 5-6 V is applied at the at source region 5012, 9V is applied at the couple control gate (CG) 5242, 0V is applied at drain region 202, 1V is applied at and the selective gate (SG) 5223. By the mechanism of the hot-electron injection, electrons are removed from the high electric field region of the channel to the floating gate (FG) 5233. Thus, the equivalent polarity of the floating gate (FG) 5233 will be negative voltage.

Perform a reading operation, such as a reading operation for word lines of non-volatile memory units 2, 20, 3 and 4. Applied 0V at source region 5012 and couple control gate (CG) 5242, or applied 1V at source region 202 applied and a supply voltage $V_{cc}$ at selective gate (SG) 5223. The channel below the selective gate (SG) 5223 will be on. Wherein the supply voltage $V_{cc}$ is the supply voltage of the memory circuit, in conventional amplifier using 0.18 micro CMOS technology, the supply voltage $V_{cc}$ will be 1.8V.

Assume that the status of the word lines 582 of the non-volatile memory units 2, 20, 3 and 4 are "0", that is the equivalent polarity of the floating gate (FG) 5233 will be negative voltage and the current in the channel is proximally 0. On the other hand, the status of word lines 582 of the non-volatile memory units 2, 20, 3 and 4 are "1", that is the equivalent polarity of the floating gate (FG) 5233 will be positive voltage. During then, the current exist in the channel is about 30 nm. By detecting the channel current of the channel region 203, the storage content of the non-volatile memory units 2, 20, 3 and 4 are known.

The foregoing description of the exemplary embodiments of the disclosure has been presented only for the purposes of illustration and description and is not intended to be exhaustive or to limit the disclosure to the precise forms disclosed. Many modifications and variations are possible in light of everything above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope.

Accordingly, the scope of the present disclosure is defined by the appended claims rather than the foregoing description and the exemplary embodiments described therein.

What is claimed is:

1. A method for manufacturing a non-volatile memory unit, comprising the steps of:
   (1) providing a substrate;
   (2) forming a first base dielectric layer on the substrate;
   (3) forming a sacrificial layer on the a first base dielectric layer;
   (4) defining a first pattern opening and a second pattern opening at the first base dielectric layer and the sacrificial layer;
   (5) performing ion implantation according to the first pattern opening;
   (6) selectively changing the thickness of the first base dielectric layer in order to form damascene grooves that spaced apart along the horizontal direction;
   (7) forming a first polycrystalline silicon layer on the first base dielectric layer and the first polycrystalline silicon layer is formed in the damascene grooves;
   (8) forming a covering dielectric layer on the first polycrystalline silicon layer;
   (9) forming a second base dielectric layer on the substrate, and the first polycrystalline silicon layer and the covering dielectric layer together form a sidewall dielectric layer;
   (10) forming a second polycrystalline silicon layer to fill spaces that extends along the horizontal direction between the first polycrystalline silicon layer and the sidewall dielectric layer;
   (11) forming a coupled dielectric layer on the second polycrystalline silicon layer, the sidewall dielectric layer and the covering dielectric layer;
   (12) selectively forming a third polycrystalline silicon layer on the coupled dielectric layer; and
   (13) defining a third pattern opening and performing ion implantation.

2. The method for manufacturing a non-volatile memory unit as claimed in claim 1, wherein step (4) further comprising steps of:
   applying the photoresist as a hard mask, etching the scarifying layer at the region outside the first pattern opening and the second pattern opening to form separated scarifying layers on the first base dielectric layer.

3. The method for manufacturing a non-volatile memory unit as claimed in claim 1, wherein step (6) further comprising steps of:
   via the first pattern opening, forming a thickened first base dielectric layer under the first pattern opening.

4. The method for manufacturing a non-volatile memory unit as claimed in claim 1, wherein step (6) further comprising steps of:
   via the second pattern opening, forming a thinned first base dielectric layer under the second pattern opening.

5. The method for manufacturing a non-volatile memory unit as claimed in claim 1, wherein step (6) further comprising steps of:
   (6-1) forming a separator at each side of the scarifying layer upon the second pattern opening; wherein the separators are electrical isolated.

6. The method for manufacturing a non-volatile memory unit as claimed in claim 1, wherein in step (7) the first polycrystalline silicon layer comprises an erase gate (EG) forming at the first pattern opening of the first base dielectric layer, and comprises a selective gate (SG) formed on the second pattern opening of the first base dielectric layer.

7. The method for manufacturing a non-volatile memory unit as claimed in claim 1, wherein step (8) further comprises:
   (8-1) according to the mask defined by the first and the second pattern openings region, removing the scarifying layer on the first base dielectric layer without removing the first polycrystalline silicon layer.

8. The method for manufacturing a non-volatile memory unit as claimed in claim 1, wherein step (8) further comprises:
   (8-2) according to the mask defined by the first and the second pattern openings region, removing the first base dielectric layer outside the first polycrystalline silicon layer.

9. The method for manufacturing a non-volatile memory unit as claimed in claim 1, wherein step (10) further comprises:
   (10-1) defining a third pattern opening, defining the region outside the third pattern opening as a mask; and removing the second polycrystalline silicon layer outside the third pattern opening.

10. The method for manufacturing a non-volatile memory unit as claimed in claim 1, wherein a first dielectric layer is defined, and the first dielectric layer comprises the first and the second base dielectric layers formed on the substrate.

11. The method for manufacturing a non-volatile memory unit as claimed in claim 1, wherein a second dielectric layer is defined, the second dielectric layer comprises the sidewall dielectric layer is formed at two sides of the first polycrystalline silicon layer, the covering dielectric layer is formed on the second polycrystalline silicon layer, and the second dielectric layer covers the erase gate (EG) and the selective gate (SG).

12. A non-volatile memory unit comprising:
   a substrate, wherein a source region and a drain region are formed on the surface, and the source region and the drain region are separated apart via a channel region;
   a first dielectric layer, formed on the substrate and defining a first pattern opening along the depth direction on the first dielectric layer;
   an erase gate (EG), formed on the first dielectric layer and disposed upon the first pattern opening's projection along the depth direction;
   a floating gate (FG), formed on the first dielectric layer and near the erase gate;
   a selective gate (SG), formed on the first dielectric layer and near the floating gate, wherein the selective gate and the floating gate are disposed upon a projection of the channel region along the depth direction;
   a second dielectric layer, formed on the first dielectric layer and covering the erase gate and the selective gate, wherein the floating gate is disposed between two adjacent second dielectric layers;
   a coupled dielectric layer, formed on the erase gate, the floating gate, the selective gate and the second dielectric layer; and
   a couple control gate (CG), formed on the coupled dielectric layer;
   wherein the first pattern opening of the first dielectric layer has a first thickness, the thickness of the first dielectric layer below the projection of the floating gate (FG) is defined as a second thickness, and the thickness of the first dielectric layer below the projection of the selective gate (SG) is defined as a third thickness,
   wherein the first thickness is thicker than the second thickness, and the second thickness is thicker than the third thickness.

13. The non-volatile memory unit of claim 12, wherein the second dielectric layer is disposed between the two sides of the erase gate, and the second dielectric layer is formed from two sides of the first pattern opening away from the erase gate.

14. The non-volatile memory unit of claim 12, wherein the first dielectric layer has a second pattern opening, which is defined by the selective gate (SG) along the depth direction.

15. The non-volatile memory unit of claim 12, wherein the first dielectric layer has a third pattern opening, which is defined by the source region along the depth direction.

16. The non-volatile memory unit of claim 12, wherein the selective gate (SG) further comprises a separator formed above the second pattern opening at each side of the selective gate (SG), and the separator is electrical isolated.

17. The non-volatile memory unit of claim 12, wherein the erase gate (EG) and the selective gate (SG) are formed in the damascene grooves, and the floating gate (FG) and the second dielectric layer are disposed between the erase gate (EG) and the selective gate (SG).

18. The non-volatile memory unit of claim 12, wherein the second dielectric layer formed above the erase gate (EG) and the selective gate (SG) is covered by a covering dielectric layer, and the covering dielectric layer is parallel to the first dielectric layer.

* * * * *